(12) United States Patent
Dobrovolny

(10) Patent No.: US 7,310,505 B2
(45) Date of Patent: Dec. 18, 2007

(54) ATTENUATION CONTROL FOR TUNERS

(75) Inventor: Pierre Dobrovolny, North Riverside, IL (US)

(73) Assignee: Zenith Electronics Corporation, Lincolnshire, IL (US)

( * ) Notice: Subject to any disclaimer, the term of this patent is extended or adjusted under 35 U.S.C. 154(b) by 543 days.

(21) Appl. No.: 10/658,478

(22) Filed: Sep. 9, 2003

(65) Prior Publication Data

US 2005/0054314 A1 Mar. 10, 2005

(51) Int. Cl.
*H04B 1/06* (2006.01)
*H04B 7/00* (2006.01)

(52) U.S. Cl. .............................. 455/234.1; 456/232.1; 456/249.1

(58) Field of Classification Search .............. 455/234.1, 455/232.1, 3.02, 131, 3.07, 4.2, 240.1, 241.2, 455/249.1, 251.1, 126, 130, 1.31, 173.1, 455/192.1, 254, 256, 296, 266, 307, 313, 455/318–319, 241.1, 243.1, 242.1, 246.1, 455/247.1, 250.1; 375/345; 348/725–735
See application file for complete search history.

(56) References Cited

U.S. PATENT DOCUMENTS

| | | | | |
|---|---|---|---|---|
| 4,320,530 A | * | 3/1982 | Ikeda | 455/182.1 |
| 5,697,095 A | * | 12/1997 | Matsuura | 455/338 |
| 5,950,112 A | * | 9/1999 | Hori et al. | 725/148 |
| 6,169,912 B1 | * | 1/2001 | Zuckerman | 455/570 |
| 6,389,272 B1 | * | 5/2002 | Horigome et al. | 455/234.1 |
| 6,400,393 B1 | * | 6/2002 | Limberg | 348/21 |
| 6,400,416 B1 | * | 6/2002 | Tomasz | 348/654 |
| 6,434,374 B1 | * | 8/2002 | Muterspaugh | 455/234.1 |
| 6,725,463 B1 | * | 4/2004 | Birleson | 725/151 |
| 6,826,388 B1 | * | 11/2004 | Tanaka et al. | 455/77 |
| 6,978,125 B2 | * | 12/2005 | Lindell et al. | 455/183.1 |
| 6,995,610 B2 | * | 2/2006 | Madni | 330/85 |
| 2002/0131533 A1 | * | 9/2002 | Koizumi | 375/345 |
| 2003/0071925 A1 | * | 4/2003 | Kanno et al. | 348/726 |

* cited by examiner

*Primary Examiner*—Pablo N. Tran

(57) ABSTRACT

A tuner includes an RF input with a signal level controller such as an attenuator that is provided to attenuate a signal from the RF input. A tunable RF filter provides RF band limiting and determines simultaneously the AGC bandwidth. An amplifier with resistive feedback provides first and second outputs which, together, represent the incident power of the attenuated signal delivered by the amplifier, thus eliminating the need for a directional coupler and rendering this part of the tuner compatible with integration. A feedback circuit responds to the incident power of the attenuated signal by controlling the attenuation (AGC) provided by the signal level controller.

37 Claims, 3 Drawing Sheets

ATTENUATION CONTROL FOR TUNERS

TECHNICAL FIELD OF THE INVENTION

The present invention relates to the control of the amount of attenuation within a tuner to prevent overload of the tuner's mixer or mixers.

BACKGROUND OF THE INVENTION

A tuner is provided in receivers such as radios and televisions to tune to a channel selected by a user. The tuner typically comprises a mixer that mixes the received RF signal with a local oscillator signal having a frequency corresponding to a selected channel. The output of the mixer is a predetermined intermediate frequency signal. In order to prevent the mixer from being overloaded by the received RF signal, an attenuator, such as a PIN diode attenuator, is provided between the RF input and the mixer. The attenuator is intended to ensure that the signal in the tuner is not so large so as to overload the mixer.

FIG. 1 shows an upconverting section 10 of a double conversion tuner without band limiting that provides an example of attenuation control in accordance with the prior art. The upconverting section 10 has an RF input 12 that receives an RF signal such as from an antenna. The RF signal is supplied to an attenuator 14 (such as a PIN diode attenuator) that is provided to attenuate the RF signal, and the RF signal at the output of the attenuator 14 is amplified by an RF amplifier 16. The RF signal at the output of the RF amplifier 16 is supplied through a directional coupler 18 to a broadband filter 20 that is arranged to filter out signal components having frequencies outside of a selected range. For example, for television applications, the broadband filter 20 filters out signal components having frequencies outside of the frequency range of 50-800 MHz. The RF signal at the output of the broadband filter 20 is provided to the RF input of a mixer 22 which also receives a local oscillator signal LO from a local oscillator. The mixer 22 mixes the RF signal on its RF input with the local oscillator signal to produce an output IF signal.

The directional coupler 18 provides coupling to the incident voltage on the line between the RF amplifier 16 and the broadband filter 20 to an amplifier 24, and this amplified voltage is provided to a detector 26. In this way, the detector input level is not affected by input impedance variations of the broadband filter 20 which otherwise would cause attenuation variations. The detected signal at the output of the detector 26 is used to control the attenuator 14 such that, as the incident voltage at the output of the RF amplifier 16 becomes too large, the RF signal is attenuated to prevent overloading of the mixer 22.

The problem with the upconverting section 10 is the cost of the directional coupler 18 and the technological incompatibility of the directional coupler 18 with the eventual tuner integration process.

SUMMARY OF THE INVENTION

In accordance with one aspect of the present invention, a tuner comprises an RF input, a signal level controller, a feedback amplifier, a mixer, and a feedback. The signal level controller is coupled to attenuate a signal from the RF input. The feedback amplifier is coupled to provide first and second outputs representing power of the attenuated signal. The mixer is coupled to mix at least one of the outputs of the amplifier with a local oscillator signal. The feedback is coupled to control the attenuation provided by the signal level controller in response to the power of the attenuated signal.

In accordance with another aspect of the present invention, a tuning method comprises the following: attenuating an RF signal received at an RF input; mixing the attenuated signal with a local oscillator signal to produce an intermediate frequency signal; developing a signal representing the power of the attenuated signal; and, controlling the attenuation of the RF signal in response to the signal representing the power of the attenuated signal so as to inhibit overloading of the mixer.

BRIEF DESCRIPTION OF THE DRAWINGS

These and other features and advantages of the present invention will become more apparent from a detailed consideration of the invention when taken in conjunction with the drawings in which.

DETAILED DESCRIPTION

Figure 1:
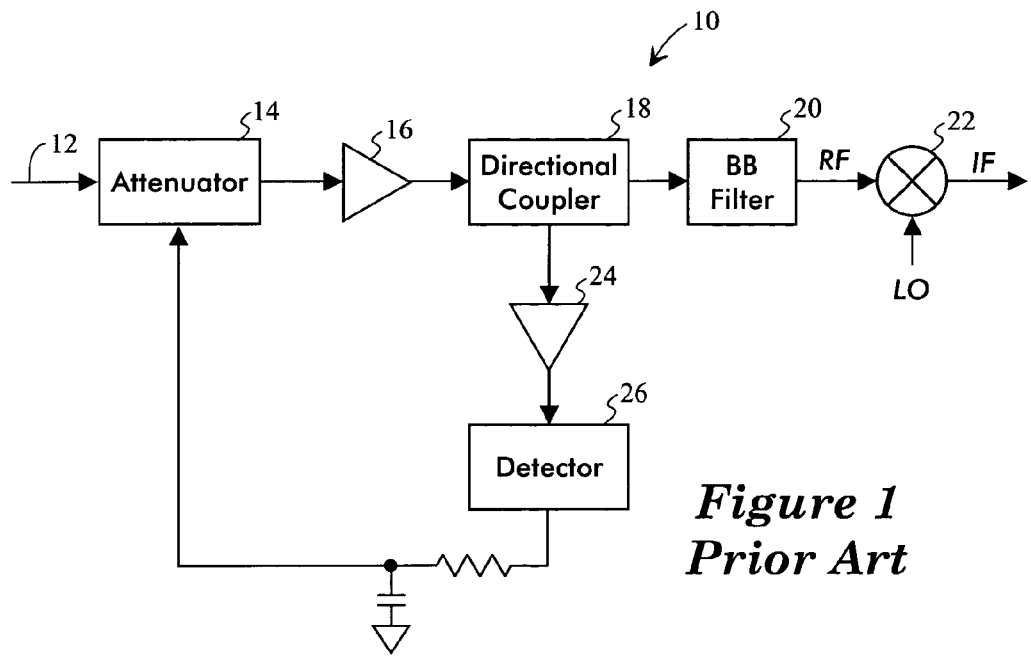
FIG. 1 illustrates a prior art upconverting section of a double converting tuner without band limiting.
Figure 2:
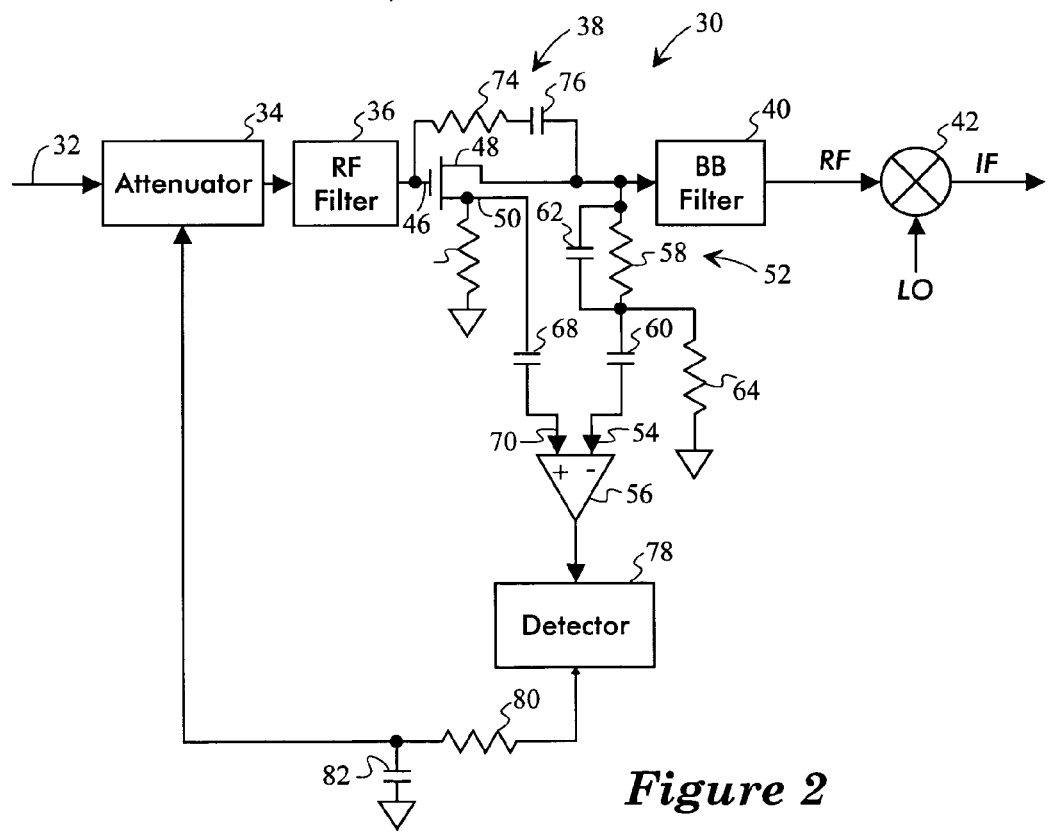
FIG. 2 illustrates an upconverting section of a double conversion tuner with RF band limiting in accordance with one embodiment of the present invention.

An upconverting section of a double conversion tuner 30, as shown in FIG. 2, has an RF input 32 for receiving an RF signal such as from an antenna. The RF signal on the RF input 32 is supplied to an attenuator 34 (such as a PIN diode attenuator) which is provided to attenuate the RF signal. The RF signal at the output of the attenuator 34 is filtered by a tunable RF filter 36 and is amplified by an RF amplifier 38. The RF signal at the output of the RF amplifier 38 is supplied to a broadband filter 40 that is arranged to filter out any signal components having frequencies outside of a selected range. For example, for television applications, the broadband filter 40 filters out signal components having frequencies outside of the frequency range of 50-800 MHz. The RF signal at the output of the broadband filter 40 is provided to the RF input of a mixer 42 which also receives a local oscillator signal LO from a local oscillator. The mixer 42 mixes the RF signal available at the output of the broadband filter 40 with the local oscillator signal LO to produce an output IF signal.

The RF amplifier 38 includes a transistor 44 having a gate 46 coupled to the output of the tunable RF filter 36. The transistor 44 also has electrodes 48 and 50. These electrodes may be drain and source electrodes in the case where the transistor 44 is a field effect transistor as shown in FIG. 2. However, the transistor 44 may be any other suitable type of an RF transistor.

The electrode 48, which is the output of the RF amplifier 38, is coupled to the broadband filter 40. The electrode 48 is also coupled through a phase compensated divider 52 to an input 54 of an amplifier 56. The input 54, for example, may be a negative input of the amplifier 56. The phase compensated divider 52 attenuates the voltage at the electrode 48 to a level comparable to the voltage at the electrode 50 and compensates for any phase shift caused by the RF amplifier 38. The phase compensated divider 52 includes a resistor 58, a capacitor 62, and a resistor 64. The resistor 58 and the capacitor 62 are coupled in parallel, and the parallel combination of the resistor 58 and the capacitor 62 couples the electrode 48 through a DC decoupling capacitor 60 to the input 54 of the amplifier 56. The resistor 64 is coupled on one end to a junction of the resistor 58 and the DC decoupling capacitor 60 and on the other end to ground.

The electrode 50 of the transistor 44 is coupled through another DC decoupling capacitor 68 to an input 70 of the amplifier, and is also coupled to ground through a resistor 72 providing resistive series feedback and closing the DC circuit of the transistor 44 to ground. The input 70, for example, may be a positive input of the amplifier 56. A resistor 74 and a DC decoupling capacitor 76 are coupled in series between the gate 46 and the electrode 48 of the transistor 44 to provide parallel resistive feedback for the amplifier 38.

The output of the amplifier 56 is coupled to a detector 78, and the output of the detector 78 is coupled through a resistor 80 to the attenuator 34. The junction of the resistor 80 and the attenuator 34 is coupled to ground through a capacitor 82 introducing thus the necessary delay into the AGC loop. The resistor 80, which is in parallel with the attenuator control port input resistance and output resistance of the detector 78, and the capacitor 82 determine a time constant for the automatic gain control.

The detected signal at the output of the detector 78 is used to control the attenuator 34 such that the RF signal is attenuated in order to prevent overloading of the mixer 42. The voltage on the electrode 48 is directly the output voltage of the RF amplifier 38, and the voltage on the electrode 50 is proportional to the current in the RF amplifier 38. Therefore, the amplifier 56 receives two signals, a first signal representing the voltage of the attenuated signal (i.e., a properly scaled down voltage from the voltage at the output of the RF amplifier 38), and a second signal representing the current of the attenuated signal. These first and second signals provided by the RF amplifier 38 together closely represent the incident power at the output of the RF amplifier 38. These first and second signals provided by the RF amplifier 38 are combined by the amplifier 56 and are then used to control the attenuator 34.

Variations in the impedance of the broadband filter 40 are compensated because the first and second signals provided by the RF amplifier 38 complement each other as the impedance of the broadband filter 40 varies. For example, as the input impedance Z of the broadband filter 40 increases, the first signal on the electrode 48 increases while the second signal on the electrode 50 decreases, thereby stabilizing sufficiently the control of the attenuator 34.

Figure 3:
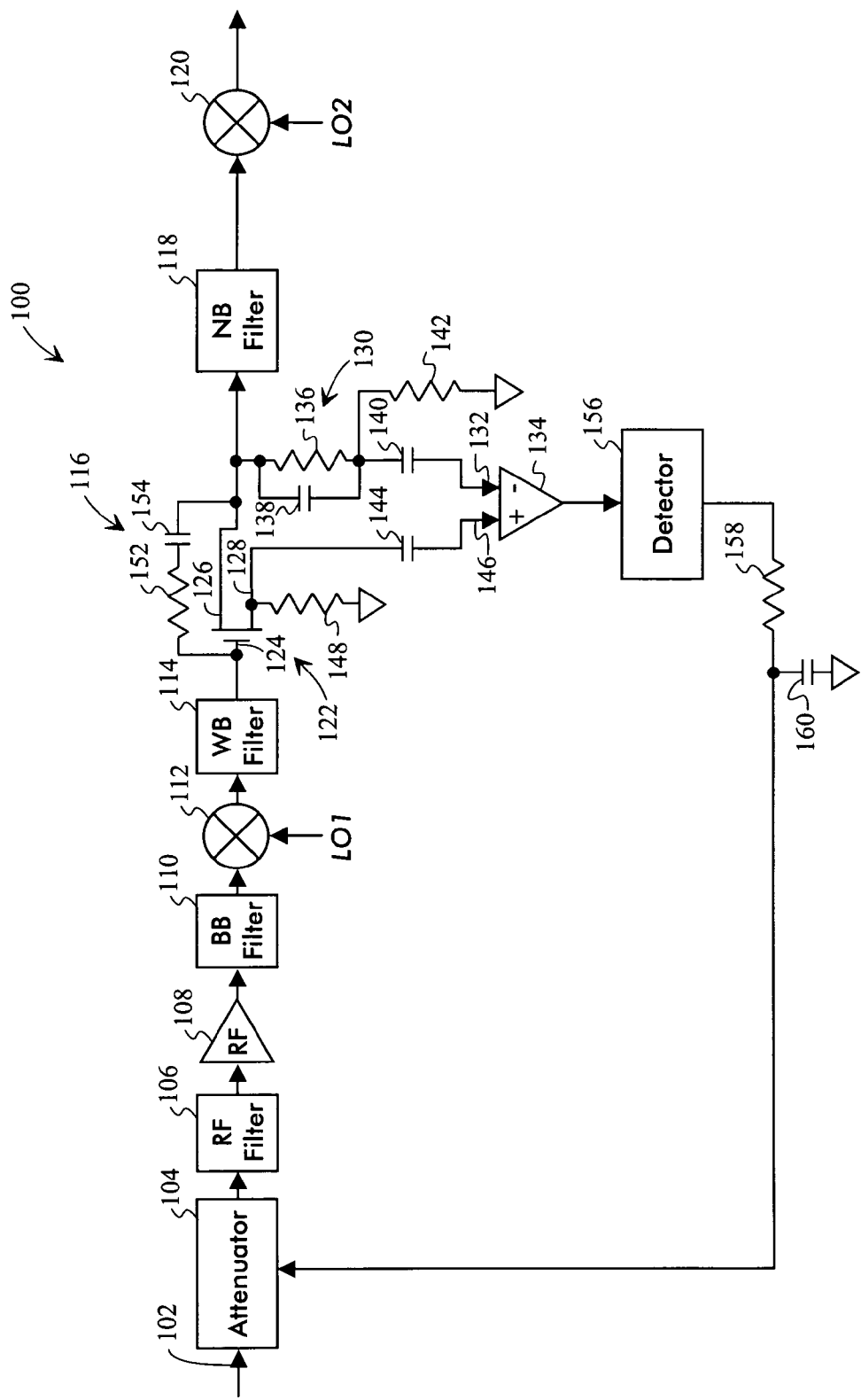
FIG. 3 illustrates an RF band limited double conversion tuner in accordance with another embodiment of the present invention; and, FIG. 4 illustrates a conventional single conversion tuner improved in accordance with yet another embodiment of the present invention.

A double conversion tuner embodiment 100, as shown in FIG. 3, has an RF input 102 for receiving an RF signal such as from an antenna. The RF signal is supplied to an attenuator 104 (such as a PIN diode attenuator) which is provided to attenuate the RF signal. The RF signal at the output of the attenuator 104 is filtered by a tunable RF filter 106 and is amplified by an RF amplifier 108. The RF signal at the output of the RF amplifier 108 is supplied to a broadband filter 110 that is arranged to filter out signal components having frequencies outside of a selected broad frequency range. For example, for television applications, the broadband filter 110 filters out signal components having frequencies outside of the frequency range of 50-800 MHz.

The RF signal at the output of the broadband filter 110 is provided to the RF input of an upconverting first mixer 112 which also receives a local oscillator signal LO1 from a local oscillator. The upconverting first mixer 112 mixes the RF signal from the broadband filter 110 with the local oscillator signal LO1 to produce an initial intermediate frequency signal.

The initial intermediate frequency signal from the upconverting first mixer 112 is supplied to a wideband filter 114. The purpose of the wideband filter 114 is mainly to minimize the effect of spurious frequencies generated by the mixing of the two local oscillator harmonics. The bandwidth of the wideband filter 114 has to be somewhat wider than the bandwidth of the tunable RF filter 106 for the AGC to function properly. The AGC frequency response has to be that of the RF filter 110 preceding the first mixer 112. That would not be the case if the wideband filter 114 was narrower than the tunable RF filter 106.

The signal at the output of the wideband filter 114 is amplified by an IF amplifier 116. The signal at the output of the IF amplifier 116 is supplied to a narrowband IF filter 118 arranged to filter out signal components having frequencies outside of a selected range. For example, for television applications, the narrowband IF filter 118 ideally filters out all undesired signal components having frequencies outside of the frequency range of ±3 MHz from the first IF center frequency. This range depends on the technology that is used and the quality (cost) of the narrowband IF filter 118.

The output of the narrowband IF filter 118 is provided to one input of a second downconverting mixer 120 which also receives a local oscillator signal LO2 from a local oscillator. The second downconverting mixer 120 mixes the signal from the narrowband IF filter 118 with the local oscillator signal LO2 to produce a final output IF signal usually around 44 MHz.

The IF amplifier 116 includes a transistor 122 having a gate 124 coupled to the output of the wideband filter 114. The transistor 122 also has electrodes 126 and 128. These electrodes may be drain and source electrodes in the case where the transistor 122 is a field effect transistor as shown in FIG. 3. However, the transistor 122 may be any other suitable type of transistor or amplifier.

The electrode 126 of the IF amplifier 116 is coupled to the input of the narrowband IF filter 118. The electrode 126 is also coupled through a phase compensated divider 130 to an input 132 of an amplifier 134. The input 132, for example, may be a negative input of the amplifier 134. The phase compensated divider 130 attenuates the voltage at the electrode 126 to a level comparable to the voltage at the electrode 128 and compensates for the phase shift caused by the IF amplifier 116. The phase compensated divider 130 includes a resistor 136, a capacitor 138, a DC decoupling capacitor 140, and a resistor 142. The resistor 136 and the capacitor 138 are coupled in parallel, and the parallel combination of the resistor 136 and the capacitor 138 couples the electrode 126 through the DC decoupling capacitor 140 to the input 132 of the amplifier 134. One end of the resistor 142 is coupled to the junction between the resistor 136 and the DC decoupling capacitor 140, and the other end of the resistor 142 is coupled to ground.

The electrode 128 of the transistor 122 is coupled through another DC decoupling capacitor 144 to an input 146 of the amplifier 134, and is also coupled to ground through a resistor 148 to provide resistive series feedback and to close the DC circuit of the transistor 122 to ground. The input 146, for example, may be a positive input of the amplifier 134. A resistor 152 and a DC decoupling capacitor 154 are coupled in series between the gate 124 and the electrode 126 of the transistor 122 to provide parallel resistive feedback for the IF amplifier 116.

The output of amplifier 134 is coupled to a detector 156, and the detector 156 is coupled through a resistor 158 to the attenuator 104. The junction of the resistor 158 and the attenuator 104 is coupled to ground through a capacitor 160. The resistor 158, which is in parallel with the attenuator control port input resistance of the attenuator 104 and output resistance of the detector 156, together with the capacitor 160 determine a time constant for the automatic gain control.

The detected signal at the output of the detector 156 is used to control the attenuator 104 such that the RF signal is attenuated in order to prevent overloading of the mixers 112 and 120. The voltage on the electrode 126 directly is the output voltage of the IF amplifier 116, and the voltage on the electrode 128 is proportional to the current in the IF amplifier 116. Therefore, the amplifier 134 receives two signals, a first signal representing the voltage of the attenuated signal (i.e., a properly scaled down voltage from the voltage at the output of the IF amplifier 116), and a second signal representing the current of the attenuated signal. These first and second signals provided by the IF amplifier 116 complement each other and together represent closely the incident power at the output of the IF amplifier 116. These first and second signals are combined by the amplifier 134 and used to control the attenuator 104.

Variation in the input impedance of the narrowband IF filter 118 is compensated because the first and second signals provided by the IF amplifier 116 complement each other as the impedance of the narrowband IF filter 118 varies. For example, as the input impedance Z of the narrowband IF filter 118 increases, the signal on the electrode 126 increases while the signal on the electrode 128 decreases, thereby stabilizing control of the attenuator 104.

The double conversion tuner embodiment 100, as depicted in FIG. 3, has the advantage of providing a higher power level for the detector 156 compared with the double conversion tuner 30 of FIG. 2. Power sensing at a higher power level renders possibly the detector design easier and less costly. In addition, the AGC frequency spectrum to be amplified by the differential amplifier 134 and detected by the detector 156 is much narrower than the AGC spectrum width associated with the double conversion tuner 30. The former AGC spectrum is a few tens of MHz (given by the RF filter bandwidth) centered around the first IF frequency while the latter is not converted to the first IF frequency. Also, the latter AGC spectrum has to accommodate the entire tuning range of the RF filter which is normally 50 to 800 MHz. The narrower the frequency spectrum to be amplified and detected by the differential amplifier 134 and the detector 156, the easier is the implementation of both.

Figure 4:
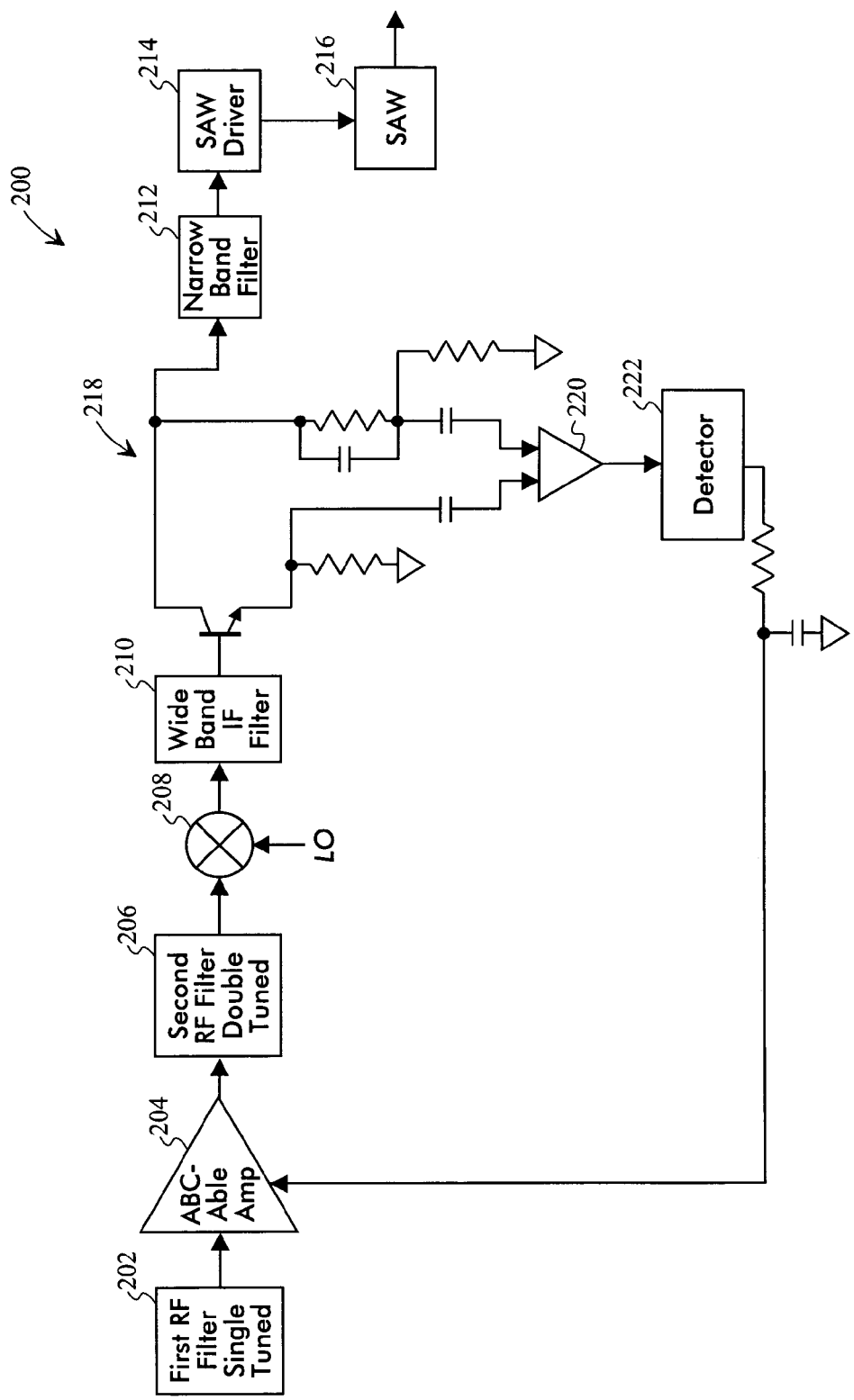

Certain modifications of the present invention have been discussed above. Other modifications will occur to those practicing in the art of the present invention. For example, a single conversion tuner 200 as depicted in FIG. 4 could be economically designed in the conventional way with a varactor tuned single tuned first RF filter 202, an AGC-able RF amplifier 204, a varactor tuned double tuned second RF filter 206, an active Gilbert cell mixer 208, LO, a wideband IF filter 210, a narrow band IF filter 212, and a SAW driver 214 coupled to a SAW 216. The new parts inserted into the otherwise standard single conversion tuner 200 would be an IF preamp stage 218 in front of the narrow band IF filter 212 to provide simultaneously the two taps for the AGC voltage and current signals. The two AGC signals are coupled to the symmetric input terminals of an amplifier 220 driving a detector 222.

The wideband IF filter 210 may not be needed if the mixer isolation from the RF to the IF port and from the LO to the IF port is sufficiently large. The RF and AGC bandwidths are, for this design, basically identical. The bandwidth of the narrow band IF filter 212, which is centered around 44 MHz, should be such as to protect the SAW driver 214 from strong adjacent channel interference.

The PIN attenuator used in the previous embodiments is now replaced with the AGC-able amplifier 204, usually a dual gate MOSFET.

The bandwidth of the wideband filter 210, if it has to be used, has to be somewhat wider than the RF bandwidth resulting from the first and second RF filters 202 and 206 combined. The signal driving the detector 222 is now band limited and centered around the IF frequency 44 MHz, which means that all the additional components become easy to design.

The embodiment as described in FIG. 4 may also be expanded into a symmetric configuration starting with the active Gilbert cell mixer 208 up to the SAW driver 214 if it has to be implemented within an integrated circuit where most of the signal paths and signal processing blocks are designed as symmetric ones.

Accordingly, the description of the present invention is to be construed as illustrative only and is for the purpose of teaching those skilled in the art the best mode of carrying out the invention. The details may be varied substantially without departing from the spirit of the invention, and the exclusive use of all modifications which are within the scope of the appended claims is reserved.

What is claimed is:

1. A tuner comprising:
    an RF input;
    a signal level controller coupled to attenuate a signal from the RF input;
    a feedback amplifier coupled to provide first and second outputs representing power of the attenuated signal;
    a mixer coupled to mix at least one of the outputs of the amplifier with a local oscillator signal; and,
    a feedback coupled to control the attenuation provided by the signal level controller in response to the power of the attenuated signal.

2. The tuner of claim 1
    further comprising a filter arranged to receive a signal from the at least one of the first and second outputs of the amplifier,
    wherein the mixer is coupled to mix an output of the filter with the local oscillator signal.

3. The tuner of claim 2 wherein the filter comprises a broadband filter arranged to filter out signal components having frequencies outside of a frequency range specified for a receiver incorporating the tuner.

4. The tuner of claim 1 wherein the feedback comprises a phase compensator arranged to compensate for a phase shift caused by the amplifier.

5. The tuner of claim 4
    further comprising a filter arranged to receive a signal from the at least one of the first and second outputs of the amplifier,
    wherein the mixer is coupled to mix an output of the filter with the local oscillator signal.

6. The tuner of claim 5 wherein the filter comprises a broadband filter arranged to filter out signal components having frequencies outside of a frequency range specified for a receiver incorporating the tuner.

7. The tuner of claim 1 wherein the mixer comprises first and second mixers, wherein the first mixer is coupled to mix an RF signal with a first local oscillator signal to produce an initial intermediate frequency signal, and wherein the second mixer is coupled to mix the initial intermediate frequency signal with a second local oscillator signal to produce a final intermediate frequency.

8. The tuner of claim 7 wherein the first mixer is coupled upstream of the amplifier, and wherein the second mixer is coupled downstream of the amplifier.

9. The tuner of claim 7 wherein the feedback comprises a phase compensator arranged to compensate for a phase shift caused by the amplifier.

10. The tuner of claim 9 wherein the first mixer is coupled upstream of the amplifier, and wherein the second mixer is coupled downstream of the amplifier.

11. The tuner of claim 1 wherein the mixer comprises first and second mixers and first, second, and third filters, wherein the first filter is coupled between the signal level controller and the first mixer, wherein the first mixer is coupled to mix an output of the first filter with a first local oscillator signal to produce an initial intermediate frequency, wherein the second filter is coupled between the first mixer and the amplifier, wherein the third filter is coupled between the amplifier and the second mixer, and wherein the second mixer is coupled to mix an output of the third filter with a second local oscillator signal to produce a final intermediate frequency.

12. The tuner of claim 11 wherein the first filter comprises a broadband filter arranged to filter out signal components having frequencies outside of a range specified for a receiver incorporating the tuner, wherein the second filter comprises a wideband filter, and wherein the third filter comprises a narrowband filter.

13. The tuner of claim 11 wherein the feedback comprises a phase compensator arranged to compensate for a phase shift caused by the amplifier.

14. The tuner of claim 13 wherein the first filter comprises a broadband filter arranged to filter out signal components having frequencies outside of a range specified for a receiver incorporating the tuner, wherein the second filter comprises a wideband filter, and wherein the third filter comprises a narrowband filter.

15. The tuner of claim 1 wherein the signal level controller comprises an attenuator.

16. The tuner of claim 15 wherein the attenuator comprises a PIN attenuator.

17. The tuner of claim 1 wherein the signal level controller comprises a gain controllable amplifier.

18. The tuner of claim 1 further comprising:
a first RF filter between the RF input and the signal level controller;
a second RF filter between the signal level controller and the mixer;
a wideband IF amplifier between the mixer and the feedback amplifier;
a narrowband IF amplifier at an output of the feedback amplifier, wherein the signal level controller comprises a gain controllable amplifier.

19. A tuning method comprising: attenuating an RF signal received at an RF input;
mixing the attenuated signal with a local oscillator signal to produce an intermediate frequency signal;
developing a signal representing the power of the attenuated signal; and,
controlling the attenuation of the RF signal in response to the signal representing the power of the attenuated signal so as to inhibit overloading of the mixer.

20. The tuning method of claim 19 wherein the developing of a signal representing the power of the attenuated signal comprises amplifying the attenuated signal to produce a first signal representative of a voltage of the attenuated signal and a second signal representative of a current of the attenuated signal, and wherein the mixing of the attenuated signal with a local oscillator signal comprises mixing at least one of the first and second signals with a local oscillator signal.

21. The tuning method of claim 20 wherein the controlling of the attenuation comprises phase compensating for a phase shift caused by the amplifying of the attenuated signal.

22. The tuning method of claim 19 further comprising
filtering the attenuated signal with a filter, wherein the mixing includes
mixing the filtered signal with the local oscillator signal.

23. The tuning method of claim 22 wherein the filter comprises a broadband filter.

24. The tuning method of claim 19 wherein the developing of a signal representing the power of the attenuated signal comprises amplifying the attenuated signal to produce a first signal representative of a voltage of the attenuated signal and a second signal representative of a current of the attenuated signal, and wherein the mixing of the attenuated signal with a local oscillator signal comprises mixing at least one of the first and second signals with a local oscillator signal.

25. The tuning method of claim 24 wherein the controlling of the attenuation comprises phase compensating for a phase shift caused by the amplifying of the attenuated signal.

26. The tuning method of claim 24 wherein the filter comprises a broadband filter.

27. The tuning method of claim 26 wherein the controlling of the attenuation comprises phase compensating for a phase shift caused by the amplifying of the attenuated signal.

28. The tuning method of claim 19 wherein the mixing comprises mixing the RF signal with a first oscillator signal to produce an intermediate frequency signal and mixing the intermediate frequency signal with a second oscillator signal to produce a final intermediate frequency signal.

29. The tuning method of claim 28 wherein the developing of a signal representing the power of the attenuated signal comprises amplifying the intermediate frequency signal to produce a first signal representative of a voltage of the attenuated signal and a second signal representative of a current of the attenuated signal.

30. The tuning method of claim 29 wherein the controlling of the attenuation comprises phase compensating for a phase shift caused by the amplifying of the attenuated signal.

31. The tuning method of claim 19 wherein the mixing of the attenuated signal with a local oscillator signal comprises:
filtering the attenuated signal in a first filter;
mixing an output of the first filter with a first local oscillator signal to produce an initial intermediate frequency signal;
filtering the initial intermediate frequency signal in a second filter;
amplifying an output of the second filter to produce first and second signals;
filtering one at least of the first and second signals in a third filter; and,
mixing an output of the third filter with a second local oscillator signal to produce a final intermediate frequency.

32. The tuning method of claim 31 wherein the first filter comprises a broadband filter arranged to filter out signal components having frequencies outside of a frequency range specified for a receiver incorporating the tuner, wherein the second filter comprises a wideband filter, and wherein the third filter comprises a narrowband filter.

33. The tuning method of claim 31 wherein the controlling of the attenuation comprises phase compensating for a phase shift caused by the amplifying of the output of the second filter.

34. The tuning method of claim 33 wherein the first filter comprises a broadband filter arranged to filter out signal components having frequencies outside of a frequency range specified for a receiver incorporating the tuner, wherein the second filter comprises a wideband filter, and wherein the third filter comprises a narrowband filter.

35. The tuning method of claim 19 wherein the attenuating of an RF signal received at an RF input comprises attenuating of an RF signal received at an RF input using an attenuator.

36. The tuning method of claim 35 wherein the attenuator comprises a PIN attenuator.

37. The tuning method of claim 19 wherein the attenuating of an RF signal received at an RF input comprises attenuating an RF signal received at an RF input using a gain controllable amplifier.

* * * * *